(12) United States Patent
Ku et al.

(10) Patent No.: US 7,309,978 B2
(45) Date of Patent: Dec. 18, 2007

(54) REFERENCE VOLTAGE GENERATING CIRCUIT WITH ULTRA-LOW POWER CONSUMPTION

(75) Inventors: Ja-nam Ku, Yongin-si (KR);
Chung-woul Kim, Andong-si (KR);
Young-hoon Min, Anyang-si (KR);
Il-jong Song, Suwon-si (KR);
Dong-hyun Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 107 days.

(21) Appl. No.: 11/359,505

(22) Filed: Feb. 23, 2006

(65) Prior Publication Data
US 2006/0192609 A1 Aug. 31, 2006

(30) Foreign Application Priority Data
Feb. 28, 2005 (KR) ...................... 10-2005-0016747

(51) Int. Cl.
*G05F 3/16* (2006.01)
*G05F 1/10* (2006.01)
*H03H 3/08* (2006.01)

(52) U.S. Cl. ........................ 323/316; 323/315; 327/538
(58) Field of Classification Search ........ 323/313–317, 323/907; 327/535, 538–544
See application file for complete search history.

(56) References Cited

U.S. PATENT DOCUMENTS

| 4,849,684 | A | * | 7/1989 | Sonntag et al. | ............. | 323/313 |
|---|---|---|---|---|---|---|
| 5,013,934 | A | * | 5/1991 | Hobrecht et al. | ........... | 327/527 |
| 6,292,050 | B1 | * | 9/2001 | Dooley et al. | .............. | 327/540 |
| 6,492,874 | B1 | * | 12/2002 | Shih | ........................... | 330/288 |
| 6,989,708 | B2 | * | 1/2006 | Xi | .............................. | 327/539 |
| 7,075,282 | B2 | * | 7/2006 | Feng | .......................... | 323/313 |
| 7,224,210 | B2 | * | 5/2007 | Garlapati et al. | ........... | 327/539 |
| 2006/0198197 | A1 | * | 9/2006 | Ku et al. | ............... | 365/185.21 |

* cited by examiner

*Primary Examiner*—Matthew V. Nguyen
(74) *Attorney, Agent, or Firm*—Sughrue Mion, Pllc.

(57) ABSTRACT

A reference voltage generating circuit with ultra-low power consumption, which includes: a constant current circuit part generating a first constant current from a supply voltage; a current mirror circuit part mirroring the constant current and supplying a second constant current; a voltage control circuit part receiving the second constant current and generating a first reference voltage by using substrate transistors driven by a PTAT (Proportional To Absolute Temperature) voltage and MOS transistors driven by a CTAT (Complementary To Absolute Temperature) voltage; and an output circuit part amplifying an output voltage from the voltage control circuit part to generate second to fourth reference voltages, and feeding back at least one of the second to fourth reference voltages to the voltage control circuit part so that the magnitude of an output voltage is adjusted. The reference voltage generating circuit is able to stably output four reference voltages, independently of changes in supply voltage, process, temperature, and other factors.

6 Claims, 5 Drawing Sheets

REFERENCE VOLTAGE GENERATING CIRCUIT WITH ULTRA-LOW POWER CONSUMPTION

CROSS-REFERENCE TO RELATED APPLICATIONS

This application claims priority from Korean Patent Application No. 10-2005-0016747, filed on Feb. 28, 2005, the entire content of which is incorporated herein by reference.

BACKGROUND OF THE INVENTION

1. Field of the Invention

Apparatuses consistent with the present invention relate to a reference voltage generating circuit, and more particularly, to a reference voltage generating circuit capable of generating a plurality of reference voltages with ultra-low power consumption.

2. Description of the Related Art

Generally, a reference voltage generating circuit generating a reference voltage stably is required to adjust a high level voltage or provide internal power supply. To this end, the reference voltage generating circuit should be able to stably output a reference voltage of a uniform magnitude, independently of changes in external power supply, temperature, process, etc.

FIG. 1A and FIG. 1B are explanatory diagrams of an operational method of a reference voltage generating circuit according to a related art. Referring to FIG. 1A, a voltage $V_{BE}$ between the base and the emitter of a bipolar junction transistor (BJT) changes by temperatures, and operates as a CTAT (Complementary To Absolute Temperature) voltage.

$$V_{BE} = -2.2 \text{ mV/T} \quad \text{[Equation 1]}$$

Therefore, as expressed in the following Equation 2, a voltage proportional to temperature is amplified to a predetermined magnitude (with reference to FIG. 1A), and added to the voltage $V_{BE}$ between the base and the emitter to generate a fixed magnitude of a reference voltage, $V_{REF} = KV_t + V_{BE}$.

$$\Delta V_{BE} = V_T 1 nm; \quad V_T = \frac{KT}{q} = 0.085 \, mVT \quad \text{[Equation 2]}$$

That is to say, as shown in FIG. 1B, a temperature-independent voltage with a fixed magnitude can be generated by adding a $V_{BE}$ between the base and the emitter of the BJT and a PTAT (Proportional To Absolute Temperature) voltage. Similarly, a reference voltage generating circuit generating a fixed magnitude of voltage independently of temperature change can be configured.

However, a drawback of the above-described reference voltage generating circuit is that its total size may be increased by resistance used because a reference voltage is generated using transistors and resistance. Also, to obtain a reference voltage, a $V_{BE}$ between the base and the emitter and a PTAT voltage should be measured and added. This, however, provides only one single reference voltage, and consumes a large amount of current overall.

FIG. 2 is a circuit diagram illustrating one example of a reference voltage generating circuit according to a related art. In particular, the circuit in FIG. 2 is used for a Low Noise Micropower Precision Reference chip such as ADR290 manufactured by Analog Device Inc., and an output voltage thereof satisfies the following.

$$V_{out} = \Delta V_P \left[ \frac{R1 + R2 + R3}{R1} \right] + IPATER3 \quad \text{[Equation 3]}$$

The reference voltage generating circuit illustrated in FIG. 2 consumes lower power because it uses a field-effect transistor (FET) instead of a transistor, yet is capable of generating a stable reference voltage. But still, it consumes 12 μA, meaning that it cannot be used in an ultra-low power system like RFID whose total power consumption is only several μA. Similar to the previous example, this type of reference voltage generating circuit also supplies only one single reference voltage, and cannot supply a reference voltage required for bias or start-up.

SUMMARY OF THE INVENTION

An aspect of the present invention is to provide a reference voltage generating circuit generating a plurality of reference voltages with ultra-low power consumption.

To achieve the above and other aspects, there is provided a reference voltage generating circuit, including: a constant current circuit part generating a first constant current from a supply voltage; a current mirror circuit part mirroring the constant current and supplying a second constant current; a voltage control circuit part receiving the second constant current and generating a first reference voltage by using substrate transistors driven by a PTAT (Proportional To Absolute Temperature) voltage and MOS transistors driven by a CTAT (Complementary To Absolute Temperature) voltage; and an output circuit part amplifying an output voltage from the voltage control circuit part to generate second to fourth reference voltages and feeding back at least one of the second to fourth reference voltages to the voltage control circuit part so that the magnitude of an output voltage is adjusted.

The voltage control circuit part may include: a first PMOS transistor whose source receives the second constant current and whose gate and drain are commonly connected; a first substrate PNP transistor whose emitter receives the second constant current, whose collector is connected to a ground source, and whose base is connected to the source of the first PMOS transistor, thereby outputting the first reference voltage; and a second substrate PNP transistor whose emitter is connected to the gate and drain of the first PMOS transistor and whose collector is connected to the ground source. Here, the first and second substrate PNP transistors are driven at subthreshold.

The output circuit part may include: a second PMOS transistor whose source is connected to the supply voltage; a third PMOS transistor whose source is connected to the supply voltage and whose gate and drain are commonly connected to the gate of the second PMOS transistor, thereby outputting the second reference voltage; a first NMOS transistor whose gate is connected to the emitter of the first substrate PNP transistor and whose drain is connected to the drain of the second PMOS transistor; a second NMOS transistor whose drain is connected to the drain of the third PMOS transistor and outputs the third reference voltage to the gate; a third NMOS transistor whose drain is commonly connected to the source of the first and second NMOS transistors, whose source is connected to the ground supply and outputs the fourth reference voltage to the gate; a fourth PMOS transistor whose source is connected to the supply voltage and whose gate is connected to the drain of the second PMOS transistor; and a fourth NMOS transistor whose gate is connected to the gate of the third NMOS transistor, whose drain is connected to the drain of the fifth PMOS transistor, and whose source is connected to the ground supply.

The reference voltage generating circuit may further includes: a first capacitor connected between the gate and the drain of the fourth PMOS transistor, and a second capacitor connected between the gate of the second NMOS transistor and the ground supply.

BRIEF DESCRIPTION OF THE DRAWINGS

The above and other aspects of the present invention will be more apparent by describing exemplary embodiments of the present invention with reference to the accompanying drawings, in which.

DETAILED DESCRIPTION OF EXEMPLARY EMBODIMENTS

An exemplary embodiment of the present invention will be described herein below with reference to the accompanying drawings.

Figure 1A:
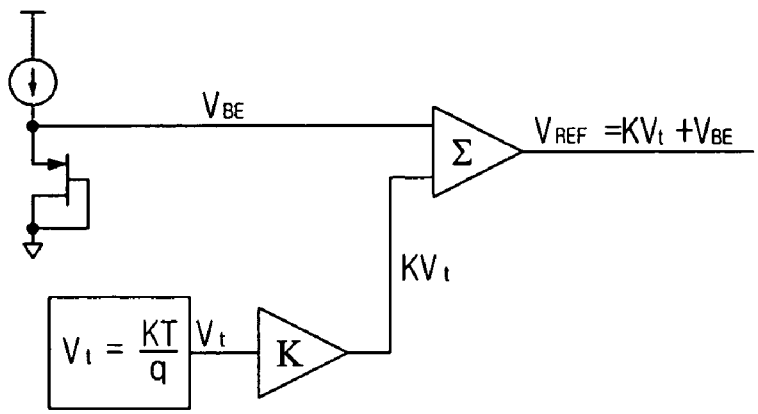
FIG. 1A and FIG. 1B are explanatory diagrams of an operational method of a reference voltage generating circuit according to a related art.
Figure 1B:
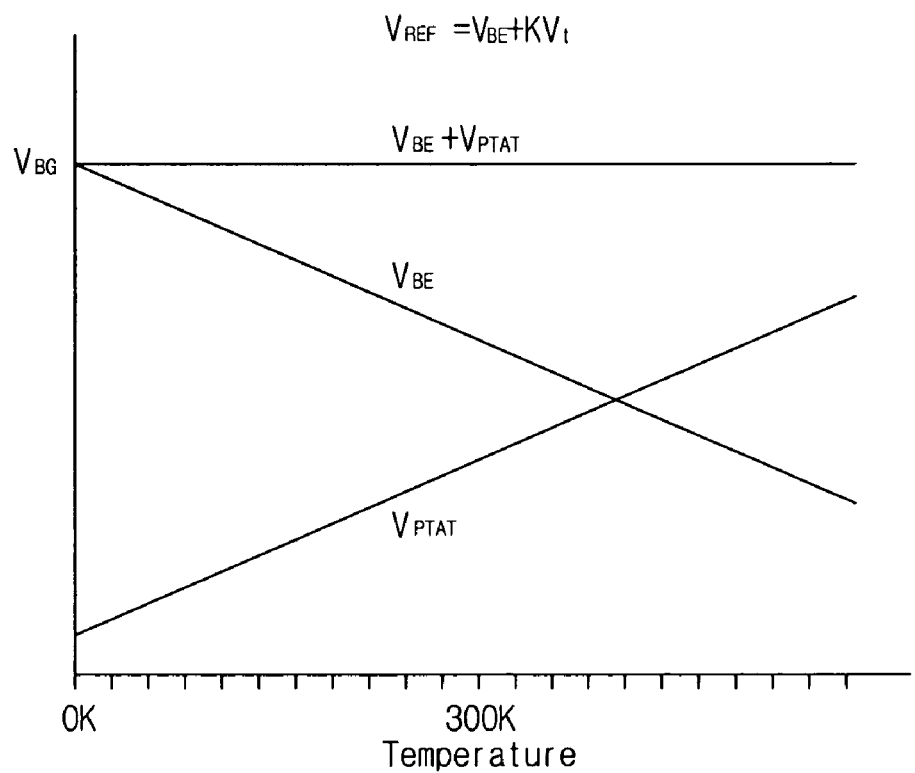
Figure 2:
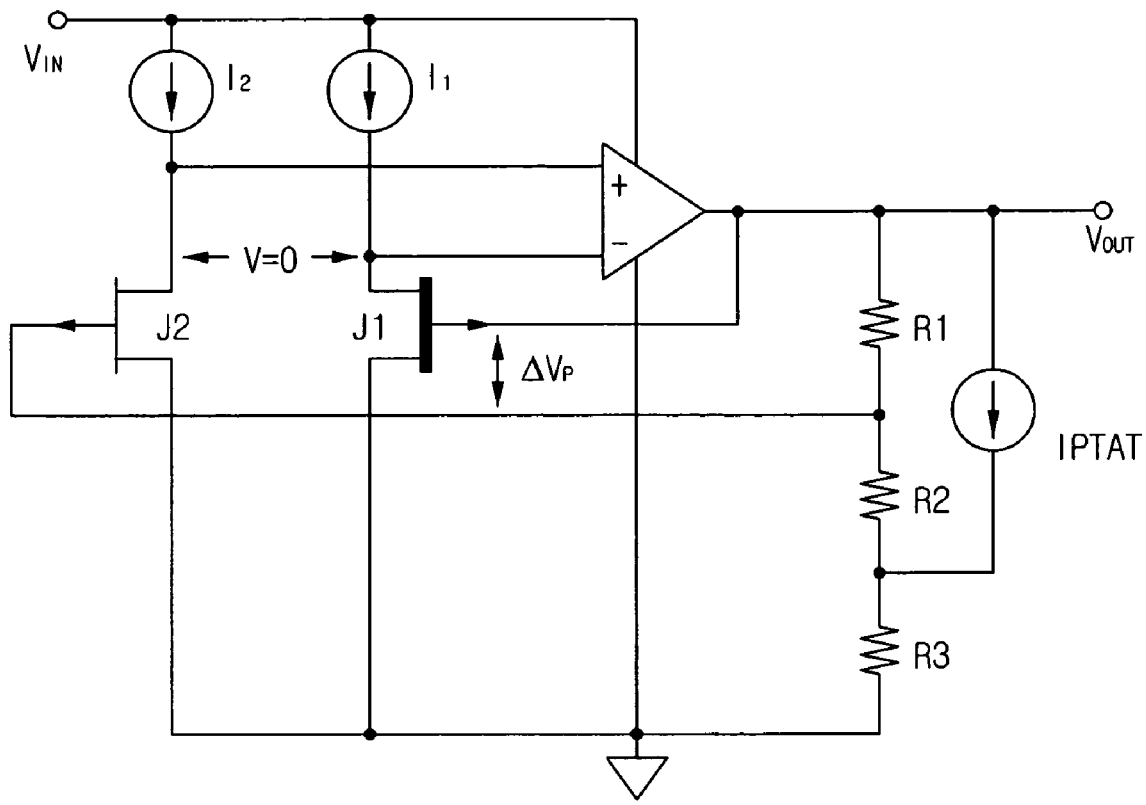
FIG. 2 is a circuit diagram illustrating one example of a reference voltage generating circuit according to a related art.
Figure 3:
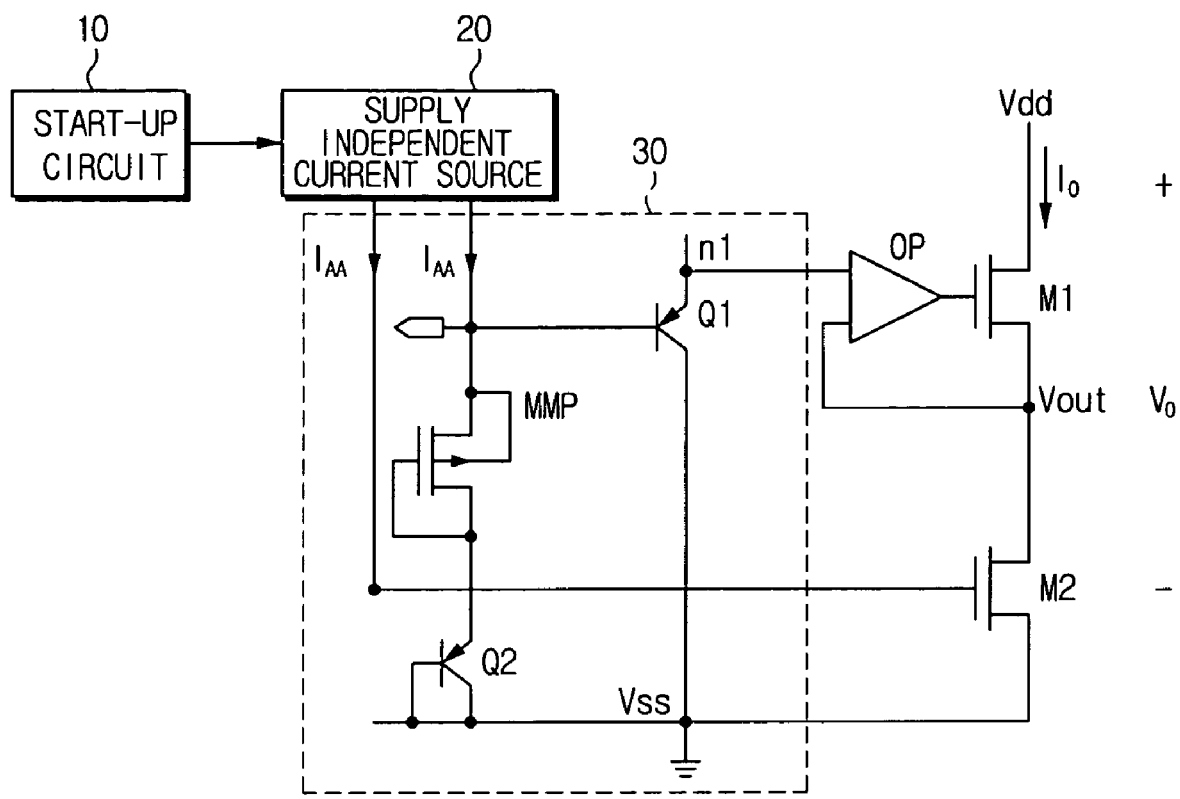
FIG. 3 is an explanatory diagram of an operational method of a voltage control circuit part used in a reference voltage generating circuit according to an exemplary embodiment of the present invention.

FIG. 3 is an explanatory diagram of an operational method of a voltage control circuit part in a reference voltage generating circuit according to an exemplary embodiment of the present invention. Referring to FIG. 3, a voltage control circuit part 30 receives a constant current $I_{AA}$ from a supply independent current source 20, and a start-up circuit 10 makes sure that the supply independent current source 20 supplies the constant current $I_{AA}$ to the voltage control circuit part 30 in a stable stage, not in an initial transient stage.

The voltage control circuit part 30 includes substrate transistors Q1, Q2 driven by a PTAT (Proportional To Absolute Temperature) voltage, and a MOS transistor MMP driven by a CTAT (Complementary To Absolute Temperature) voltage. As mentioned before, the voltage control circuit part 30 receives a constant current $I_{AA}$ from the supply independent current source 20, and receives a feedback of an output voltage from a voltage follower including an OP amp (OP) and MOS transistors (M1, M2). In this way, the voltage control circuit part 30 is able to stably generate a reference voltage $V_0$ independently of the supply voltage, process, temperature, etc. The voltage control circuit part 30 drives the substrate PNP transistors Q1 and Q2 at subthreshold, so that power consumption is low. In short, this voltage control circuit part enables the reference voltage generating circuit of the present invention to stably generate a reference voltage.

Figure 4:
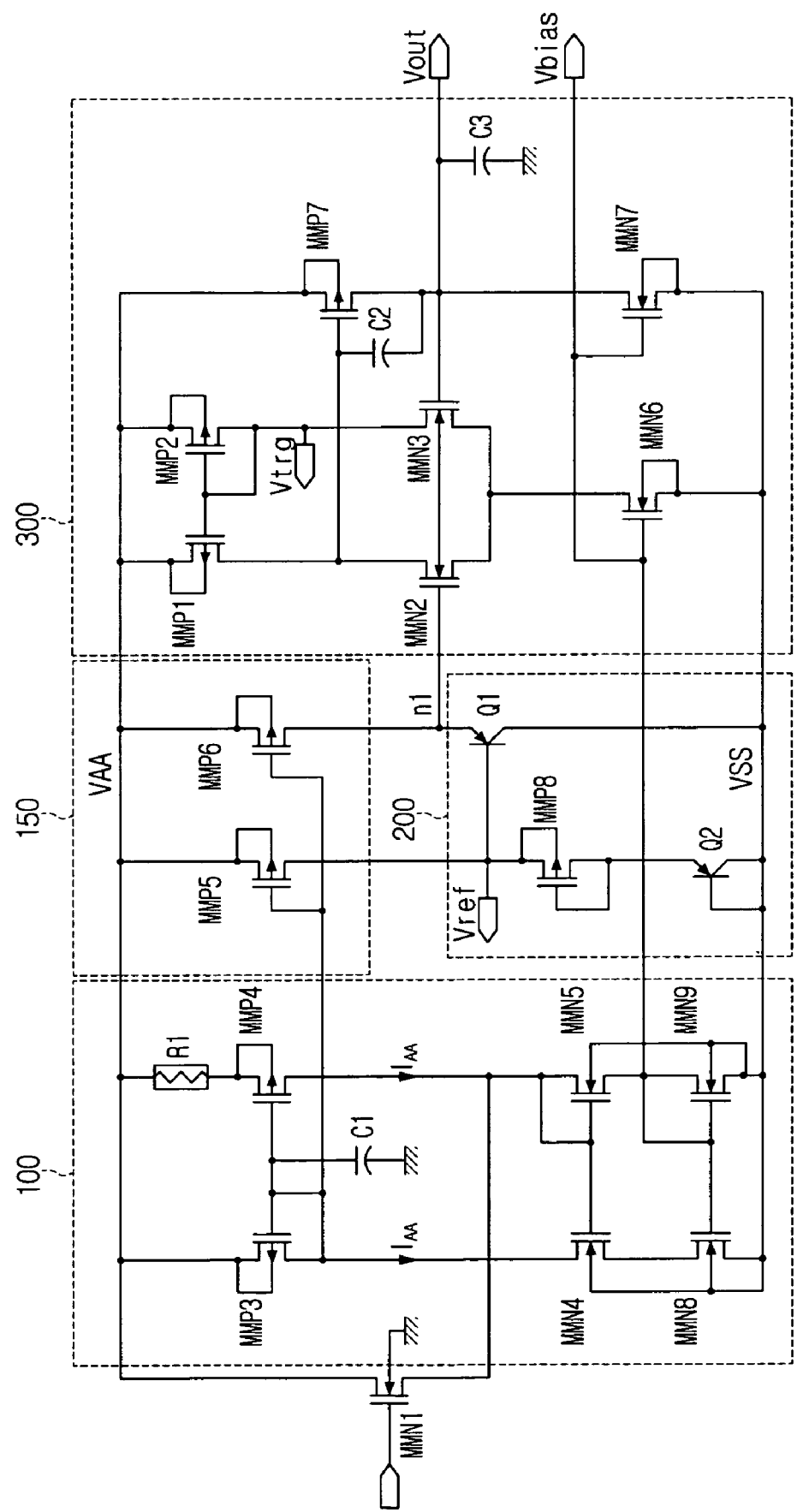
FIG. 4 is a circuit diagram of a reference voltage generating circuit according to an exemplary embodiment of the present invention.

FIG. 4 is a circuit diagram of a reference voltage generating circuit according to an exemplary embodiment of the present invention. As shown in FIG. 4, the reference voltage generating circuit includes a constant current circuit part 100, a current mirror circuit part 150, a voltage control circuit part 200, and an output circuit part 300.

The constant circuit part 100 supplies a constant current $I_{AA}$ generated from a supply voltage VAA. A Beta-multiplier constant current source circuit may be used as the constant circuit part 100. The current mirror circuit 150 performs mirroring on the constant current $I_{AA}$ supplied from the constant current source circuit part 100, and provides the mirrored current to the voltage control circuit part 200.

The voltage control circuit part 200 includes substrate transistors Q1, Q2, and a PMOS transistor MMP8. In detail, the mirrored constant current of the current mirror circuit part 150 is inputted to the source of the PMOS transistor MMP8 and the emitter of the PNP transistor Q1, respectively. The gate and drain of the PMOS transistor MMP8 are commonly connected. Also, the collector of the PNP transistor Q1 is connected to the ground power supply, whereas the base of the PNP transistor Q1 is connected to the source of the PMOS transistor MMP8, thereby outputting a first reference voltage Vref. The emitter of the PNP transistor Q2 is commonly connected to the gate and drain of the PMOS transistor MMP8, and the base and collector thereof are connected to the ground power supply. As shown with reference to FIG. 4, the voltage control circuit part 200 controls an output voltage independently of the supply voltage, process, temperature, and outputs the first reference voltage Vref. The reason for using substrate transistors in the voltage control circuit part 200 is to minimize output voltage change against process change.

The output circuit part 300 includes PMOS transistors MMP1, MMP2, and MMP7, and NMOS transistors MMN2, MMN3, MMN6, and MMN7. In detail, the source of each PMOS transistor MMP1 and MMP2 is connected to the supply voltage VAA, and the gate and drain of the PMOS transistor MMP2 are commonly connected to the gate of the PMOS transistor MMP1, thereby outputting a second reference voltage Vtrg.

The gate of the NMOS transistor MMN2 is connected to the emitter of the PNP transistor Q1, and the drain of the NMOS transistor MMN2 is connected to the drain of the PMOS transistor MMP1. The drain of the NMOS transistor MMN3 is connected to the drain of the PMOS transistor MMP2, and outputs a third reference voltage Vout to the gate. The source of the NMOS transistor MMN6 and the source of the NMOS transistor MMN7 are connected to the ground supply VSS, whereas the gates thereof are commonly connected, thereby outputting a fourth reference voltage Vbias. The source of the PMOS transistor MMP7 is connected to the supply voltage VAA, the gate of the PMOS transistor MMP7 is connected to the drain of the PMOS transistor MMP1, and the drain of the PMOS transistor MMP7 is connected to the drain of the NMOS transistor MMN7. Moreover, a capacitor C2 is connected between the gate and drain of the PMOS transistor MMP7, and a capacitor C3 is connected between the gate and ground supply of the NMOS transistor MMN3.

The output circuit part 300 outputs Vtrg, Vout, and Vbias using a differential amplifier and a feedback circuit. An output voltage from the output circuit part 300 is fed back to the voltage control circuit part 200, so that the magnitude of the output voltage may be adjusted.

Therefore, the reference voltage generating circuit of this exemplary embodiment may be applied to an ultra-low power system whose total current consumption is only several μA. This is achieved because the substrate PNP transistors Q1 and Q2 are driven at subthreshold, and current consumption is reduced below 200 nA by using MOS transistors.

Figure 5:
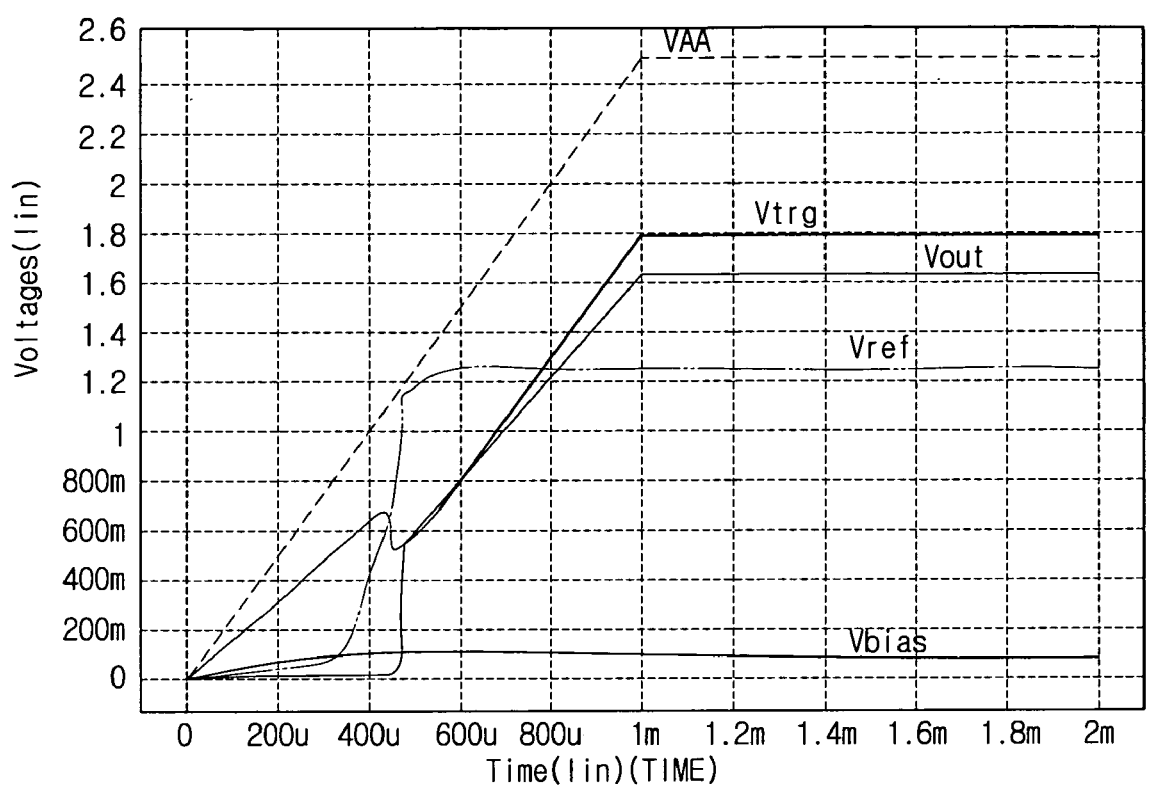
FIG. 5 graphically shows the waveform of an output voltage from a reference voltage generating circuit according to an exemplary embodiment of the present invention.

FIG. 5 is a graph illustrating the waveform of each output voltage from the reference voltage generating circuit according to an exemplary embodiment of the present invention. As can be seen in FIG. 5, the reference voltage generating circuit of exemplary embodiments of the present invention is able to stably generate Vout, Vtrg, and Vbias in addition to the reference voltage Vref. These may be used as a reference voltage for bias or start-up.

As explained so far, according to exemplary embodiments of the present invention, the reference voltage can be stably outputted, independently of changes in the supply voltage, process, temperature, etc. In addition, the reference voltage generating circuit of exemplary embodiments of the present invention is capable of generating four reference voltages, which may be used for bias or start-up. Since the total power consumption is below 200 nA, the reference voltage generating circuit of exemplary embodiments of the present invention can be applied to an ultra-low power system such as RFID.

The foregoing embodiments are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A reference voltage generating circuit, comprising:
   a constant current circuit part which generates a first constant current from a supply voltage;
   a current mirror circuit part which mirrors the constant current and supplies a second constant current;
   a voltage control circuit part which receives the second constant current and generates a first reference voltage by using substrate transistors driven by a Proportional To Absolute Temperature (PTAT) voltage and MOS transistors driven by a Complementary To Absolute Temperature (CTAT) voltage; and
   an output circuit part which amplifies an output voltage from the voltage control circuit part to generate second to fourth reference voltages, and feeds back at least one of the second to fourth reference voltages to the voltage control circuit part so that a magnitude of the output voltage is adjusted.

2. The reference voltage generating circuit according to claim 1, wherein the voltage control circuit part comprises:
   a first PMOS transistor whose source receives the second constant current and whose gate and drain are commonly connected;
   a first substrate PNP transistor whose emitter receives the second constant current, whose collector is connected to a ground source, and whose base is connected to the source of the first PMOS transistor, thereby outputting the first reference voltage; and
   a second substrate PNP transistor whose emitter is connected to the gate and drain of the first PMOS transistor and whose collector is connected to the ground source.

3. The reference voltage generating circuit according to claim 2, wherein the first and second substrate PNP transistors are driven at subthreshold.

4. The reference voltage generating circuit according to claim 2, wherein the output circuit part comprises:
   a second PMOS transistor whose source is connected to the supply voltage;
   a third PMOS transistor whose source is connected to the supply voltage and whose gate and drain are commonly connected to the gate of the second PMOS transistor, thereby outputting the second reference voltage;
   a first NMOS transistor whose gate is connected to the emitter of the first substrate PNP transistor and whose drain is connected to the drain of the second PMOS transistor;
   a second NMOS transistor whose drain is connected to the drain of the third PMOS transistor, and which outputs the third reference voltage at the gate of the second NMOS transistor;
   a third NMOS transistor whose drain is commonly connected to the source of the first and second NMOS transistors, whose source is connected to the ground supply, and which outputs the fourth reference voltage at the gate of the third NMOS transistor;
   a fourth PMOS transistor whose source is connected to the supply voltage and whose gate is connected to the drain of the second PMOS transistor; and
   a fourth NMOS transistor whose gate is connected to the gate of the third NMOS transistor, whose drain is connected to the drain of the fourth PMOS transistor, and whose source is connected to the ground supply.

5. The reference voltage generating circuit according to claim 4, further comprising:
   a first capacitor connected between the gate and the drain of the fourth PMOS transistor.

6. The reference voltage generating circuit according to claim 4, further comprising:
   a second capacitor connected between the gate of the second NMOS transistor and the ground supply.

* * * * *